US00RE50316E

(19) United States
(12) Reissued Patent
Park et al.

(10) Patent Number: US RE50,316 E
(45) Date of Reissued Patent: *Feb. 25, 2025

(54) ORGANIC LIGHT-EMITTING DISPLAY DEVICE WITH SPACER BETWEEN SUB-PIXELS

(71) Applicant: LG Display Co., Ltd., Seoul (KR)

(72) Inventors: Eun-Jung Park, Goyang-si (KR); Kwan-Soo Kim, Paju-si (KR); Byung-Soo Kim, Goyang-si (KR); Han-Byeol Seok, Seoul (KR); Su-Hyeon Kim, Goyang-si (KR); Seok-Hyun Kim, Goyang-si (KR)

(73) Assignee: LG Display Co., Ltd., Seoul (KR)

( * ) Notice: This patent is subject to a terminal disclaimer.

(21) Appl. No.: 17/939,817

(22) Filed: Sep. 7, 2022

Related U.S. Patent Documents

Reissue of:
(64) Patent No.: 10,516,004
Issued: Dec. 24, 2019
Appl. No.: 15/816,984
Filed: Nov. 17, 2017

U.S. Applications:
(63) Continuation of application No. 16/918,989, filed on Jul. 1, 2020, now Pat. No. Re. 49,260, which is an application for the reissue of Pat. No. 10,516,004.

(30) Foreign Application Priority Data

Dec. 30, 2016 (KR) ..... 10-2016-0184428

(51) Int. Cl.
*H01L 27/32* (2006.01)
*G09G 3/20* (2006.01)
(Continued)

(52) U.S. Cl.
CPC ..... *H10K 59/353* (2023.02); *G09G 3/20* (2013.01); *G09G 3/3225* (2013.01); *H10K 59/12* (2023.02);
(Continued)

(58) Field of Classification Search
CPC ..... H01L 27/3218; H01L 27/3244; H01L 27/3216; H01L 51/5012; H01L 51/5056;
(Continued)

(56) References Cited

U.S. PATENT DOCUMENTS 8,736,156 B2 5/2014 Kwon et al.
8,981,638 B2 3/2015 Isa
(Continued)

FOREIGN PATENT DOCUMENTS

CN 104051493 A 9/2014
CN 105047683 A 11/2015
(Continued)

OTHER PUBLICATIONS

Translation of KR-20090021710 (Year: 2009).*
(Continued)

*Primary Examiner* — Ling X Xu
(74) *Attorney, Agent, or Firm* — Fenwick & West LLP

(57) ABSTRACT

Disclosed is an organic light-emitting display device, which prevents lateral current leakage by providing a structure on a bank so as to cut off an organic material, which is formed in a subsequent process, around the structure.

16 Claims, 9 Drawing Sheets

(51) Int. Cl.

| | |
|---|---|
| ***G09G 3/3225*** | (2016.01) |
| ***H01L 29/08*** | (2006.01) |
| ***H01L 35/24*** | (2006.01) |
| ***H01L 51/00*** | (2006.01) |
| ***H01L 51/50*** | (2006.01) |
| ***H01L 51/52*** | (2006.01) |
| ***H10K 59/12*** | (2023.01) |
| ***H10K 59/122*** | (2023.01) |
| ***H10K 59/35*** | (2023.01) |
| *H10K 50/11* | (2023.01) |
| *H10K 50/15* | (2023.01) |
| *H10K 50/16* | (2023.01) |
| *H10K 50/17* | (2023.01) |
| *H10K 50/81* | (2023.01) |
| *H10K 50/82* | (2023.01) |

(52) U.S. Cl.
CPC ... *H10K 59/122* (2023.02); *G09G 2300/0452* (2013.01); *G09G 2310/0264* (2013.01); *G09G 2310/0291* (2013.01); *G09G 2354/00* (2013.01); *H10K 50/11* (2023.02); *H10K 50/15* (2023.02); *H10K 50/16* (2023.02); *H10K 50/17* (2023.02); *H10K 50/81* (2023.02); *H10K 50/82* (2023.02); *H10K 59/352* (2023.02)

(58) Field of Classification Search
CPC ..... H01L 51/5072; H01L 51/5088; H01L 51/5206; H01L 51/5221; G09G 3/3225; G09G 2300/0452
See application file for complete search history.

(56) References Cited

U.S. PATENT DOCUMENTS

| | | | | |
|---|---|---|---|---|
| 8,994,015 | B2 | 3/2015 | Pyon et al. | |
| 9,054,058 | B2 | 6/2015 | Sugisawa et al. | |
| 9,087,965 | B2 | 7/2015 | Hatano et al. | |
| 9,337,244 | B2 | 5/2016 | Hatano et al. | |
| 9,356,082 | B2 | 5/2016 | Isa | |
| 9,508,778 | B2 | 11/2016 | Kim et al. | |
| 10,403,851 | B2 | 9/2019 | Kim et al. | |
| 11,264,591 | B2 | 3/2022 | Kim et al. | |
| 2011/0221334 | A1 | 9/2011 | Kwon et al. | |
| 2012/0217516 | A1 | 8/2012 | Hatano et al. | |
| 2012/0326201 | A1* | 12/2012 | Ohnuma | H01L 51/0085 257/99 |
| 2013/0001620 | A1 | 1/2013 | Sugisawa et al. | |
| 2014/0035456 | A1 | 2/2014 | Isa | |
| 2014/0103368 | A1 | 4/2014 | Hatano et al. | |
| 2014/0252321 | A1 | 9/2014 | Pyon et al. | |
| 2015/0187852 | A1 | 7/2015 | Isa | |
| 2015/0311473 | A1* | 10/2015 | Kim | H01L 51/0011 257/40 |
| 2016/0020260 | A1* | 1/2016 | Im | H01L 27/3216 257/40 |
| 2016/0225833 | A1* | 8/2016 | Kim | H01L 27/3246 |
| 2016/0329521 | A1 | 11/2016 | Kim et al. | |
| 2016/0342038 | A1* | 11/2016 | Shih | G02F 1/134309 |
| 2017/0155075 | A1* | 6/2017 | Bi | H01L 51/525 |
| 2018/0013092 | A1* | 1/2018 | Park | H01L 27/3216 |
| 2019/0273220 | A1 | 9/2019 | Kim et al. | |

FOREIGN PATENT DOCUMENTS

| | | | | | |
|---|---|---|---|---|---|
| GB | 2508092 | A | * | 5/2014 | H01L 51/50 |
| JP | 2013-033728 | A | | 2/2013 | |
| JP | 2014-044938 | A | | 3/2014 | |
| JP | 2014-082133 | A | | 5/2014 | |
| KR | 10-2009-0004672 | A | | 1/2009 | |
| KR | 10-2009-0021710 | A | | 3/2009 | |
| KR | 10-2011-0101760 | A | | 9/2011 | |
| KR | 10-2014-0052969 | A | | 5/2014 | |
| KR | 10-2015-0124360 | A | | 11/2015 | |
| KR | 10-2016-0132190 | A | | 11/2016 | |

OTHER PUBLICATIONS

China National Intellectual Property Administration, Office Action, CN Patent Application No. 201711477800.2, May 7, 2021, 15 pages.
Korean Office Action, Korean Intellectual Property Office Patent Application No. 10-2016-0184428, Jun. 30, 2022, 21 pages.
United States Office Action, U.S. Appl. No. 15/816,984, filed Jun. 24, 2019, 18 pages.
United States Office Action, U.S. Appl. No. 15/816,984, filed Mar. 15, 2019, 18 pages.
United States Office Action, U.S. Appl. No. 16/918,989, filed Feb. 7, 2022, 18 pages.
Korean Intellectual Property Office, Office Action, Korean Patent Application No. 10-2023-0154589, Feb. 29, 2024, 17 pages.

* cited by examiner

Amended

ORGANIC LIGHT-EMITTING DISPLAY DEVICE WITH SPACER BETWEEN SUB-PIXELS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

[This application] *More than one reissue application has been filed for the reissue of U.S. Pat. No. 10,516,004. The reissue applications are U.S. patent application Ser. No. 18/526,518, Ser. No. 17/938,817 (the present application), and Ser. No. 16/918,989. U.S. patent application Ser. No. 18/526,518 filed on Dec. 1, 2023 is a continuation reissue application of U.S. patent application Ser. No. 17/939,817 (the present application) filed on Sep. 7, 2022, which is a continuation reissue application of U.S. patent application Ser. No. 16/918,989 filed on Jul. 1, 2020 (now U.S. Pat. No. RE49,260), which is an application for reissue of U.S. Pat. No. 10,516,004 issued on Dec. 24, 2019, which was filed as U.S. patent application Ser. No. 15/816,984 on Nov. 17, 2017, which* claims the benefit of Republic of Korea Patent Application No. 10-2016-0184428, filed on Dec. 30, 2016, which is hereby incorporated by reference as if fully set forth herein.

BACKGROUND OF THE INVENTION

Field of the Invention

The present invention relates to an organic light-emitting display device, and more particularly, to an organic light-emitting display device with a structure on a bank to cut off an organic material.

Discussion of the Related Art

Recently, as the information age has fully arrived, the field of displays that visually display electrically conveyed information signals has developed rapidly. In response to this, various kinds of flat panel display devices having excellent characteristics, such as a small thickness, a low weight, and low power consumption, have been developed and have rapidly replaced existing cathode ray tubes (CRTs).

Representative examples of such flat panel display devices may include a liquid crystal display (LCD) device, a plasma display panel (PDP) device, a field emission display (FED) device, and an organic light-emitting display (OLED) device.

Among these, the organic light-emitting display device is considered a competitive application because it does not require a separate light source and enables realization of a compact device design and vivid color display.

The organic light-emitting display device includes organic light-emitting elements, which are independently driven on a per-sub-pixel basis. Such an organic light-emitting element includes an anode, a cathode, and a plurality of organic layers between the anode and the cathode.

The organic layers include a hole injection layer, a hole transport layer, an organic light-emitting layer, and an electron transport layer, which are sequentially disposed from the anode. Among these, the organic light-emitting layer substantially functions to emit light as the energy of excitons, produced via the combination of holes and electrons, falls down to the ground state. The other layers function to assist in the transport of holes or electrons to the organic light-emitting layer.

In addition, in the organic light-emitting display device, for color display, sub-pixels are divided into red, green, and blue sub-pixels, and on a per-sub-pixel basis, an organic light-emitting layer having the color of a corresponding sub-pixel is formed. Generally, deposition using a shadow mask is used to form the organic light-emitting layer.

However, when the shadow mask has a large area, the shadow mask may droop due to the weight thereof, and thus may cause deterioration in a yield rate when used multiple times. Therefore, the other organic layers excluding the light-emitting layer are continuously formed in common in the respective sub-pixels without the shadow mask.

However, since current may flow laterally through the resulting common layer of the sub-pixels that is continuously formed in a plane, lateral current leakage may occur.

FIG. 1 is a cross-sectional view illustrating a lateral current leakage phenomenon in a conventional organic light-emitting display device. Considering one form of the conventional organic light-emitting display device, as illustrated in FIG. 1, in each sub-pixel on a substrate 10, a first electrode 11, a bank 12, which is superimposed on the edge of the first electrode 11 and defines an emission portion, and a hole injection layer 13 and a hole transport layer 14, which cover the first electrode 11 and the bank 12, are formed in sequence. In addition, light-emitting layers 16 and 17, an electron transport layer 18, and a second electrode 19 are formed in sequence above the hole transport layer 14.

In addition, in a red sub-pixel in which a light-emitting area between the first and second electrodes 11 and 19 is formed higher than those of other sub-pixels according to resonance conditions, in order to match such a light-emitting height, an auxiliary hole transport layer 15 may be further provided between the hole transport layer 14 and the red light-emitting layer 16. The position of a light-emitting layer at which the maximum wavelength is obtained may be differently set between the first and second electrodes 11 and 19 for each color of light. A red light-emitting layer may be located at the highest height, a green light-emitting layer may be located at the second highest height, and a blue light-emitting layer may be located at the lowest height. Accordingly, a green sub-pixel may further include an auxiliary hole transport layer between the hole transport layer and the green light-emitting layer, and the auxiliary hole transport layer provided in the green sub-pixel may be thinner than the auxiliary hole transport layer 15 provided in the red sub-pixel.

However, as illustrated in FIG. 1, in the conventional organic light-emitting display device, upon low-gradation blue illumination, a phenomenon in which an adjacent red sub-pixel is also turned on occurs. This is caused by a phenomenon in which, although a voltage is applied between the first electrode and the second electrode of only a blue sub-pixel in order to emit pure blue light, current flowing through a vertical electric field between the first electrode (anode) and the second electrode (cathode) of the blue sub-pixel when turned on leaks laterally through a common layer, causing an adjacent sub-pixel to be turned on.

The lateral current leakage, in particular, is clearly visible in a low-gradation display. This is because, when current, which horizontally flows in the blue sub-pixel, flows laterally to common organic layers, the adjacent red sub-pixel, which is in an off state, acts as if it were turned on. In this case, color purity may be deteriorated, and the display of pure blue gradation is difficult.

This is because the drive voltage required for red illumination is lower than the drive voltage required for blue illumination, and therefore, causes a similar illumination effect even by a small amount of leaked current.

In particular, such other color illumination caused by lateral current leakage may cause color mixing in a low-gradation display, which may prevent a desired color from being normally displayed.

In addition, the lateral current leakage may have a greater effect on the adjacent sub-pixel when the hole mobility of the common organic layer is increased.

SUMMARY OF THE INVENTION

Embodiments relate to an organic light-emitting display device comprising a substrate, a first electrode, a bank, a first spacer, an organic stack, and a second electrode. The substrate includes a plurality of pixels. Each pixel comprises a first sub-pixel, a second sub-pixel and a third sub-pixel. Each of the first to third sub-pixels have an emission portion and a non-emission portion surrounding the emission portion. The first electrode is on the emission portion of each of the first to third sub-pixels. A bank is on the non-emission portion. The first spacer has a negatively tapered shape and is provided on the bank at least between the first sub-pixel and the second sub-pixel. The organic stack is above the first electrode and the first spacer. The organic stack on the first electrode is spaced from sides of the first electrode. A second electrode is disposed on the organic stack. The length of the first spacer in a first direction is shorter than the dimension of the first sub-pixel in the first direction. The second sub-pixel and the third sub-pixel are separated from the first sub-pixel in a second direction crossing the first direction.

In one or more embodiments, the length of the first spacer is greater than a dimension of the emission portion of the second sub-pixel.

In one or more embodiments, the second sub-pixel and the third sub-pixel are alternately disposed in a first direction. The first spacer extends between the first sub-pixel and the third sub-pixel.

In one or more embodiments, the first sub-pixel extends in the first direction at least to an edge of the third sub-pixel. The edge is located at a side of the third pixel away from the second sub-pixel.

In one or more embodiments, the first spacer comprises a first segment between the first sub-pixel and the second sub-pixel and a second segment between the second sub-pixel and the third sub-pixel. The first segment and the second segment are directly connected.

In one or more embodiments, the first spacer comprises a first segment between the first sub-pixel and the second sub-pixel, and a second segment between the first sub-pixel and the third sub-pixel. The first segment and the second segment are separated in the first direction.

In one or more embodiments, the second segment is longer than a dimension of the second sub-pixel or a dimension of the third sub-pixels in the second direction.

In one or more embodiments, the first spacer has a width ranging from 1 μm to 5 μm in the direction crossing the first direction.

In one or more embodiments, a threshold voltage of the first sub-pixel is higher than a threshold voltage of the second sub-pixel.

[In one or more embodiments, a threshold voltage of the first sub-pixel is higher than a threshold voltage of the second sub-pixel.]

In one or more embodiments, the organic light-emitting display device includes a second spacer placed between the second sub-pixel and the third sub-pixel. The second sub-pixel and the third sub-pixel are smaller than the first sub-pixel.

In one or more embodiments, the second spacer is higher than the first spacer.

In one or more embodiments, the organic stack includes a hole injection layer contacting the first electrode, and at least one stack. Each of the at least one stack includes a sequential stack of a hole transport layer, a light-emitting layer, and an electron transport layer.

In one or more embodiments, the organic stack comprises a plurality of stacks. Each of the stack includes a sequential stack of a hole transport layer, a light-emitting layer and an electron transport layer, the device further including a charge generation layer between the plurality of stacks.

[In one or more embodiments, at last one layer of the organic stack has a gap at sides of the first spacer.]

In one or more embodiments, at least one layer of the organic stack has a gap at the sides of the first spacer.

In one or more embodiments, at least one layer of the organic stack on the first spacer has an island shape.

[In one or more embodiments, at least one layer of the organic stack on the first spacer has an island shape.]

In one or more embodiments, the first sub-pixel is a blue sub-pixel, the second sub-pixel is a red sub-pixel, and the third sub-pixel is a green sub-pixel.

Embodiments also relate to an organic light emitting device, comprising a first sub-pixel, a second sub-pixel and a spacer. The first sub-pixel in a pixel emits light of a first color. The first sub-pixel comprises two first electrodes and a first portion of an organic stack sandwiched between the two first electrodes. The second sub-pixel is adjacent to and spaced apart from the first sub-pixel in the pixel. The second sub-pixel emits light of a second color. The second sub-pixel comprises two second electrodes and a first portion of the organic stack sandwiched between the two second electrodes. The spacer is between the first sub-pixel and the second sub-pixel. The spacer disconnects the first portion of the organic stack and the second portion of the organic stack. The length of the spacer in a first direction is shorter than the dimension of the first sub-pixel in the first direction. The second sub-pixel is separated from the first sub-pixel in a second direction crossing the first direction.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
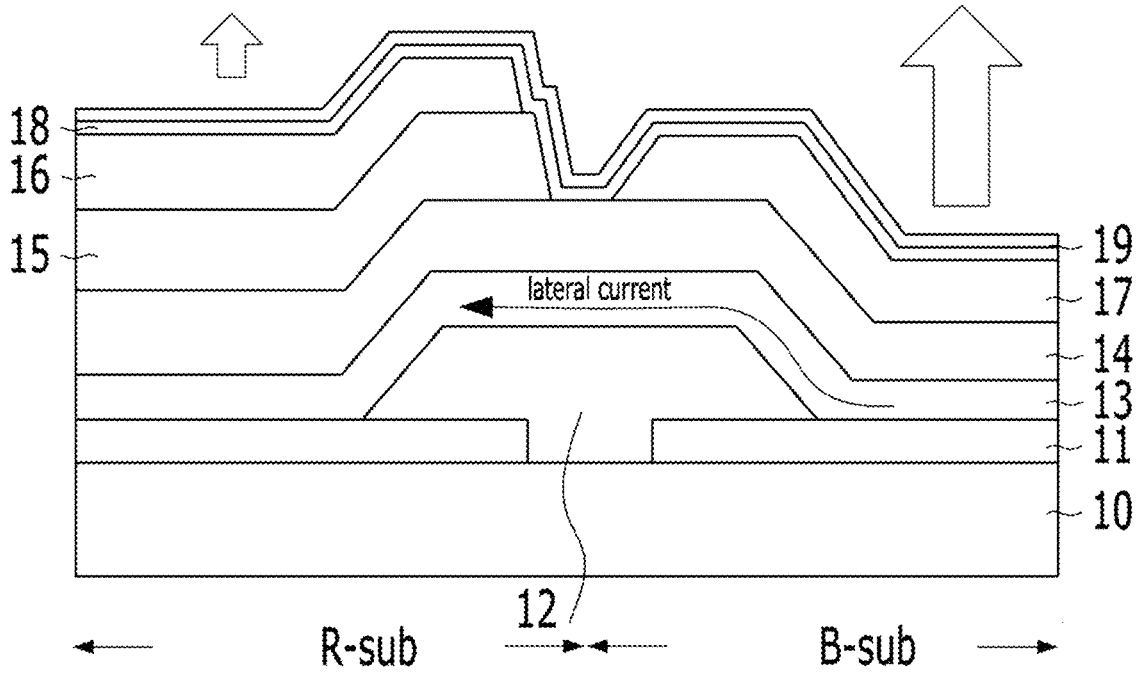
PRIOR ART FIG. 1
FIG. 1 is a cross-sectional view illustrating a lateral current leakage phenomenon in a conventional organic light-emitting display panel.

The advantages and features of the present invention and the way of attaining them will become apparent with reference to embodiments described below in detail in conjunction with the accompanying drawings. The present invention, however, are not limited to the embodiments disclosed hereinafter and may be embodied in many different forms. Rather, these exemplary embodiments are provided so that this disclosure will be through and complete and will fully convey the scope to those skilled in the art. The scope of the present invention should be defined by the claims.

In the drawings for explaining the exemplary embodiments of the present invention, for example, the illustrated shape, size, ratio, angle, and number are given by way of example, and thus, are not limited to the disclosure of the present invention. Throughout the present specification, the same reference numerals designate the same constituent elements. In addition, in the following description of the present invention, a detailed description of known functions and configurations incorporated herein will be omitted when it may make the subject matter of the present invention rather unclear. The terms "comprises," "includes," and/or "has", used in this specification, do not preclude the presence or addition of other elements unless it is used along with the term "only". The singular forms are intended to include the plural forms as well, unless the context clearly indicates otherwise.

In the interpretation of constituent elements included in the various embodiments of the present invention, the constituent elements are interpreted as including an error range even if there is no explicit description thereof.

In the description of the various embodiments of the present invention, when describing positional relationships, for example, when the positional relationship between two parts is described using "on", "above", "below", "aside", or the like, one or more other parts may be located between the two parts unless the term "directly" or "closely" is used.

In the description of the various embodiments of the present invention, when describing temporal relationships, for example, when the temporal relationship between two actions is described using "after", "subsequently", "next", "before", or the like, the actions may not occur in succession unless the term "directly" or "just" is used.

In the description of the various embodiments of the present invention, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present invention unless otherwise mentioned.

The respective features of the various embodiments of the present invention may be partially or wholly coupled to and combined with each other, and various technical linkage and driving thereof are possible. These various embodiments may be performed independently of each other, or may be performed in association with each other.

In this specification, a stack refers to a unit structure that includes organic layers such as a hole transport layer and an electron transport layer and an organic light-emitting layer interposed between the hole transport layer and the electron transport layer. The organic layers may further include a hole injection layer, an electron blocking layer, a hole blocking layer, and an electron injection layer, and may further include other organic layers according to the structure or design of an organic light-emitting element.

Embodiments relate to providing an organic light-emitting display device, in which lateral current leakage is prevented by a structure on a bank that cuts off an organic material.

*First Embodiment*

Figure 2:
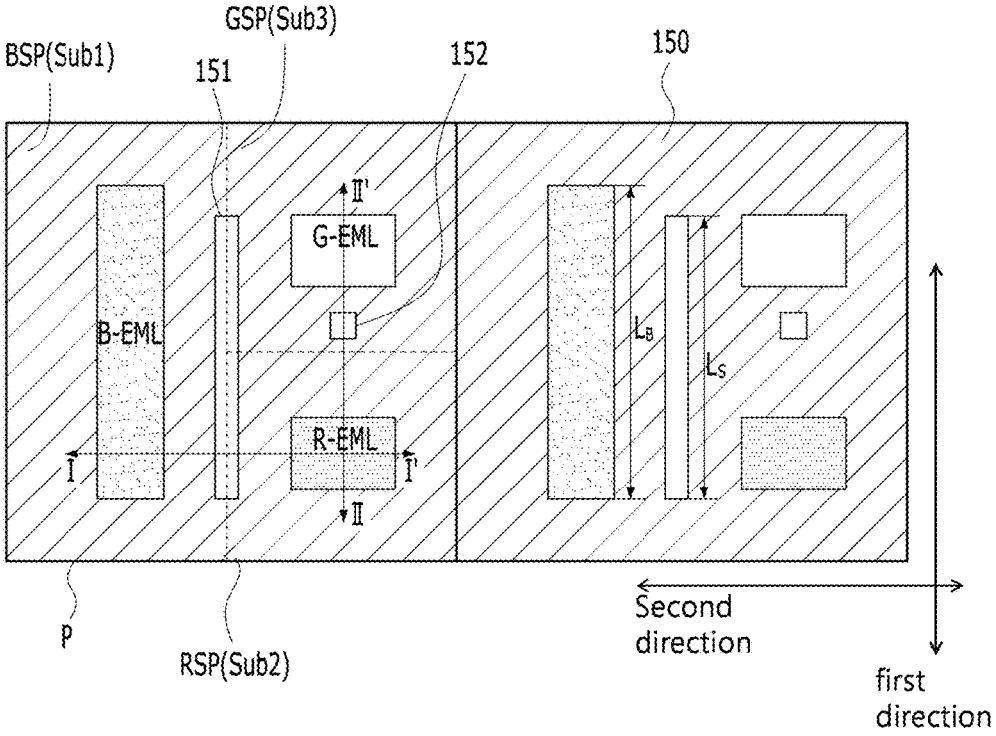
FIG. 2 is a plan view illustrating an organic light-emitting display device according to a first embodiment of the present invention.
Figure 3:
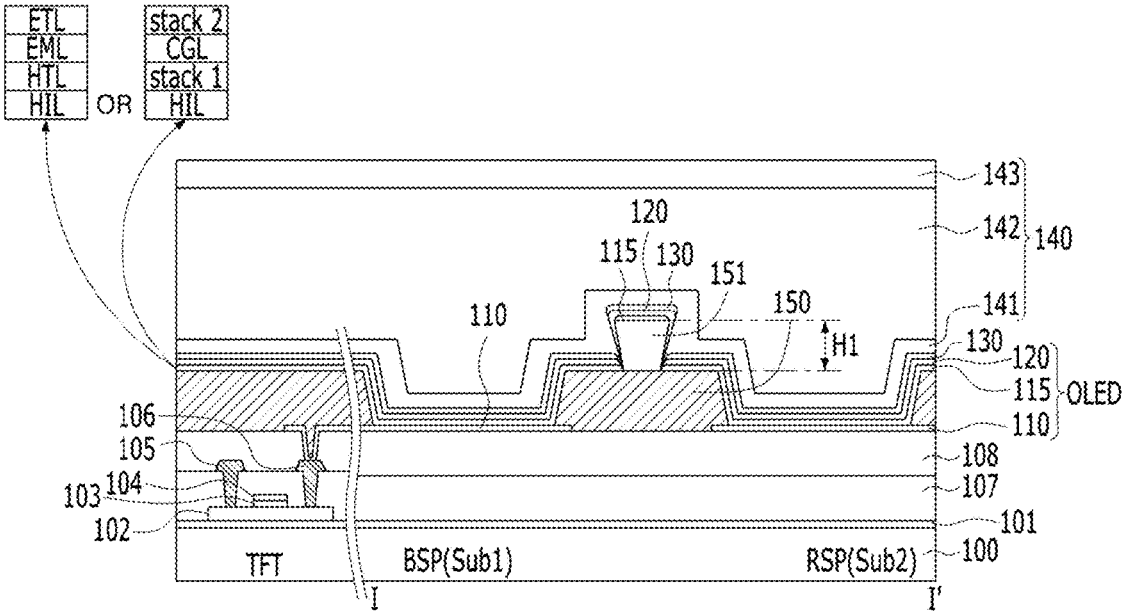
FIG. 3 is a cross-sectional view taken along line I-I' of FIG. 2 illustrating a region in which a thin-film transistor of each sub-pixel is formed.
Figure 4:
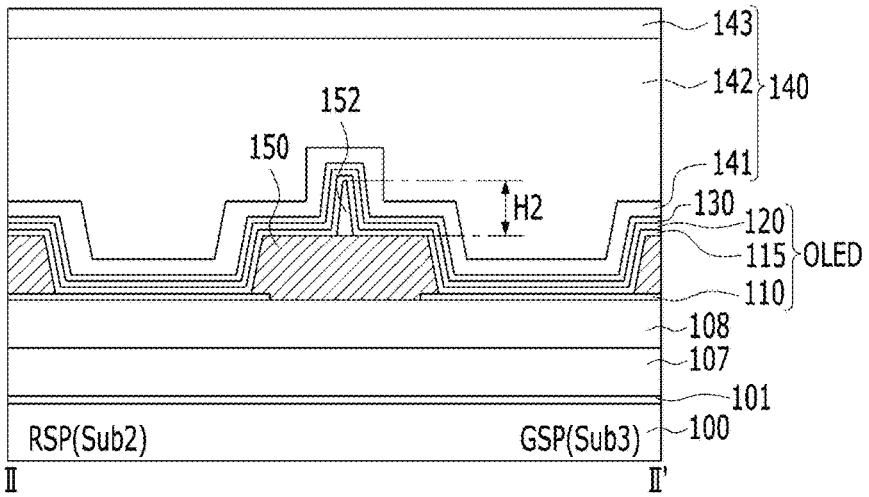
FIG. 4 is a cross-sectional view taken along line II-II' of FIG. 2.

FIG. 2 is a plan view illustrating an organic light-emitting display device according to a first embodiment of the present invention, FIG. 3 is a cross-sectional view taken along line I-I' of FIG. 2 illustrating a region in which a thin-film transistor of each sub-pixel is formed, and FIG. 4 is a cross-sectional view taken along line II-II' of FIG. 2.

As illustrated in FIGS. 2 to 4, the organic light-emitting display device according to the first embodiment of the present invention includes a substrate 100 having a plurality of first to third sub-pixels Sub 1, Sub 2 and Sub 3 each having an emission portion (designated by B-EML, G-EML or R-EML in FIG. 2) and a non-emission portion surrounding the emission portion, a first electrode 110 provided on the emission portion of each of the first to third sub-pixels Sub 1, Sub 2 and Sub 3, a bank 150 provided on the non-emission portion, a first spacer 151 having a negatively (inversely) tapered shape. The first spacer 151 is provided on the bank 150 at least between the first sub-pixel Sub 1 and the second sub-pixel Sub 2, an organic stack 115 is disposed on the first electrode 110 and the first spacer 151 so as to have a gap at sides of the first spacer 151, and a second electrode 120 is disposed on the organic stack 115. The organic stack 115 on the first electrode 110 is spaced from sides of the first electrode 110.

In one or more embodiments, the threshold voltage of the first sub-pixel Sub1 is higher than the threshold voltage of the second sub-pixel Sub2. The threshold voltage of the third sub-pixel Sub3 is lower than the threshold voltage of the first sub-pixel Sub1 and the third sub-pixel Sub3. Due to its higher threshold voltage, the leakage current from the first sub-pixel Sub1 is likely to turn on the second sub-pixel or the third sub-pixel even when theses sub-pixels are not to be turned on.

In the following description, the first sub-pixel Sub 1 refers to a blue sub-pixel BSP having the largest area among the sub-pixels, the second sub-pixel Sub 2 refers to a red sub-pixel RSP, and the third sub-pixel Sub 3 refers to a green sub-pixel GSP. In addition, the first to third sub-pixels Sub 1, Sub 2 and Sub 3 are included in a single pixel P.

First, referring to the arrangement of the sub-pixels with reference to FIG. 2, the second sub-pixel Sub 2 and the third sub-pixel Sub 3 may be alternately disposed in a first direction (the vertical direction in FIG. 2), and one first sub-pixel Sub 1 may be disposed adjacent to a pair including the second sub-pixel Sub 2 and the third sub-pixel Sub 3 in a second direction (the horizontal direction in FIG. 2) crossing the first direction.

In the first direction, the length $L_S$ of the first spacer 151 may be less than the length $L_B$ of the emission portion B-EML of the first sub-pixel Sub 1 and may be greater than the length of the emission portion R-EML of the second sub-pixel Sub 2.

In addition, the width of the first spacer 151 in the direction crossing the first direction may range from 1 μm to 5 μm.

In the organic light-emitting display device of the present invention, the reason why the first spacer 151 has the length $L_S$ and the width described above is as follows.

The organic stack 115, which is deposited after the first spacer 151 is formed, as illustrated in FIG. 3, has good straightness and thus readily accumulates on a flat portion upon deposition, but may not accumulate or may be partially disconnected when it meets a structure that has a smaller dimension at the bottom than the dimension at the top of the structure (i.e., a negatively tapered structure). Hence, the organic stack 115 is cut off at the lateral portion of the negatively tapered structure. Meanwhile, the second electrode 120 provided on the organic stack 115 is formed of a metal and thus is randomly deposited due to the more diffuse reflection of metal particles than organic particles, thus having excellent coverage. However, when the second electrode 120 meets the first spacer 151 having a negatively tapered shape and the difference in the diameter between the top and the bottom of the first spacer 151 is increased (i.e. the angle between the lateral portion and the flat portion of the first spacer 151 is reduced), there may occur a portion on which the second electrode 120 is not deposited. Therefore, by forming the first spacer 151 of the present invention in such a manner that the width thereof ranges from 1 μm to 5 μm and the length thereof is less than that of the first sub-pixel Sub 1 having the largest length, it is possible to prevent an increase in the sheet resistance of the second electrode 120, which is formed throughout the sub-pixels, even if the second electrode 120 is spaced apart from the lateral portion of the first spacer 151 and has a hole the same size as the first spacer 151, which may occur in serious cases. That is, the width and length of the first spacer 151 are determined so as to allow the organic stack 115 to be separated between the sub-pixels at the lateral portion of the first spacer 151 and to prevent an increase in the sheet resistance of the second electrode 120.

Meanwhile, a second spacer 152 having a positively tapered shape may be further provided on the bank 150 between the second sub-pixel Sub 2 and the third sub-pixel Sub 3.

Here, the second height H2 of the second spacer 152 is greater than the first height H1 of the first spacer 151. Because the second spacer 152 serves to primarily support a fine metal mask, which is used in a subsequent process of depositing an organic material (e.g., the fine metal mask is used when a light-emitting layer is selectively formed for each sub-pixel), so as to prevent the fine metal mask from being brought into contact with the bank 150 or the first spacer 151 thereunder when the fine metal mask droops due to the weight thereof, the second spacer 152 is formed higher than the first spacer 151. The first height H1 of the first spacer 151 substantially ranges from 1 μm to 1.5 μm, and the second height H2 of the second spacer 152 substantially ranges from 1.7 μm to 2.5 μm.

Meanwhile, the organic stack 115 may be of a single stack type that includes a hole injection layer HIL that is in contact with the first electrode 110, a hole transport layer HTL, a light-emitting layer EML, and an electron transport layer ETL, which are sequentially stacked one above another. Alternatively, the organic stack 115 may be of a tandem type that includes a hole injection layer HIL, a plurality of stacks stack 1 and stack 2, and a charge generation layer CGL between the stacks stack 1 and stack 2. The number of stacks used in the tandem structure may be two or more. In addition, the stacks used in the tandem structure may basically include a hole transport layer, a light-emitting layer and an electron transport layer, and may further include a hole control layer, an electron control layer, an electron blocking layer, and a hole blocking layer, which are disposed close to the light-emitting layer. In addition, the charge generation layer CGL used in the tandem structure may include an n-type charge generation layer and a p-type charge generation layer stacked one above another.

As described above, because the hole injection layer HIL, which is formed in contact with the first electrode 110, uses a p-type dopant having high conductivity, this may become a major cause of lateral current leakage when neighboring sub-pixels are connected to each other. In addition, in a structure including a plurality of stacks, because a higher density of dopant than that in the hole injection layer HIL is introduced into the p-type charge generation layer, which is additionally provided, the p-type charge generation layer may become another cause of lateral current leakage when it has the shape of a common layer between neighboring sub-pixels.

In the organic light-emitting display device of the present invention, because the first spacer 151, which is auxiliary provided on the bank 150, has a negatively tapered shape (so that the angle between the lateral portion and the flat surface portion becomes an acute angle when viewing the first spacer 151 in cross section), an organic material is disconnected at the first spacer 151 in the process of being vapor-deposited so that at least one layer of the organic stack 115 has a gap between neighboring sub-pixels.

When observing FIG. 2, because the organic stack 115 may be disconnected on the lateral portion of the first spacer 151, the organic stack 115 deposited on the upper flat portion of the first spacer 151 may be isolated in an island shape. Thus, the organic stack 115 is electrically disconnected between the first sub-pixel Sub 1 on the left side of the first spacer 151 and the second sub-pixel Sub 2 and the third sub-pixel Sub 3 on the right side of the first spacer 151, which prevents lateral current leakage. Thereby, a phenomenon, in which lateral current leakage occurs in the organic stack 115, more particularly, in a common layer having high conductivity, thereby causing an adjacent sub-pixel to be turned by leakage current when a specific sub-pixel is turned on, may be controlled.

Meanwhile, in the organic light-emitting display device of the present invention, a thin-film transistor is provided under an organic light-emitting diode OLED, which includes the first electrode 110, the organic stack 115 and the second electrode 120, and is connected to the first electrode 110. Although the thin-film transistor TFT is provided in the non-emission portion in most cases, the thin-film transistor TFT may be provided in the emission portion when a top-emission-type is applied.

The thin-film transistor TFT includes a buffer layer 101 on the substrate 100, an active layer 102 provided in a specific region, a gate insulation layer 103 and a gate electrode 104 sequentially formed on the center of the active layer 102, and a source electrode 105 and a drain electrode 106 connected to opposite ends of the active layer 102.

Here, the thin-film transistor TFT further includes an interlayer insulation layer 107 provided between the active layer 102 and the flat portions of the source electrode 105 and the drain electrode 106. The interlayer insulation layer 107 has contact holes that correspond to regions at which the active layer 102 is connected to the source electrode 105 and the drain electrode 106.

In addition, the thin-film transistor TFT further includes a protective layer 108 provided to expose a portion of the drain electrode 106 and to cover the remaining portion of the drain electrode 106 and the source electrode 105. The first electrode 110 is provided on the protective layer 108 and is connected to the drain electrode 106.

The first electrode 110 may be provided in each of the sub-pixels Sub 1, Sub 2 and Sub 3, and may be larger than the emission portion so as to cover at least the emission portion. A portion of the first electrode 110 beyond the emission portion may overlap bank 150.

The organic light-emitting diode OLED includes a capping layer 130, which protects the second electrode 120 formed on the entire surface and exerts an out-coupling function, and an encapsulator 140 in which a first inorganic layer 141, a first organic layer 142, and a second inorganic layer 143 are alternately stacked one above another.

The encapsulator 140 may further include one or more encapsulation pairs each including an organic layer and an inorganic layer.

Here, the organic stack 115, the second electrode 120 and the capping layer 130, which are formed after the bank 150, the first spacer 151 and the second spacer 152 are formed, have a total thickness of 6000 Å or less, unlike the bank 150 and the first and second spacers 151 and 152, which have a thickness on the order of micrometers. Therefore, in the stacking process thereof, the organic stack 115, the second electrode 120 and the capping layer 130 may be formed along stepped portions of the bank 150 and the first and second spacers 151 and 152.

On the other hand, the encapsulator 140 functions to prevent the permeation of moisture into the organic light-emitting diode OLED, to protect the organic light-emitting diode OLED from the outside air, and to prevent foreign substances generated during processing from having a negative effect on the organic light-emitting diode OLED. After the encapsulator 140 is completely formed, the upper surface thereof may be flattened. The inorganic layers 141 and 143 included in the encapsulator 140 substantially have a thickness ranging from 1 μm to 2 μm and effectively prevent the permeation of moisture, and the organic layer 142 has a thickness of 10 μm and is effective for particle coverage.

Meanwhile, the bank 150, the first spacer 151 and the second spacer 152 may be formed together using a multi-tone mask or a diffraction exposure mask. In this case, the bank 150 may be integrally formed with the first spacer 151 or the second spacer 152.

In some cases, the bank 150, the first spacer 151 and the second spacer 152 may be separately patterned.

*Second Embodiment*

Figure 5:
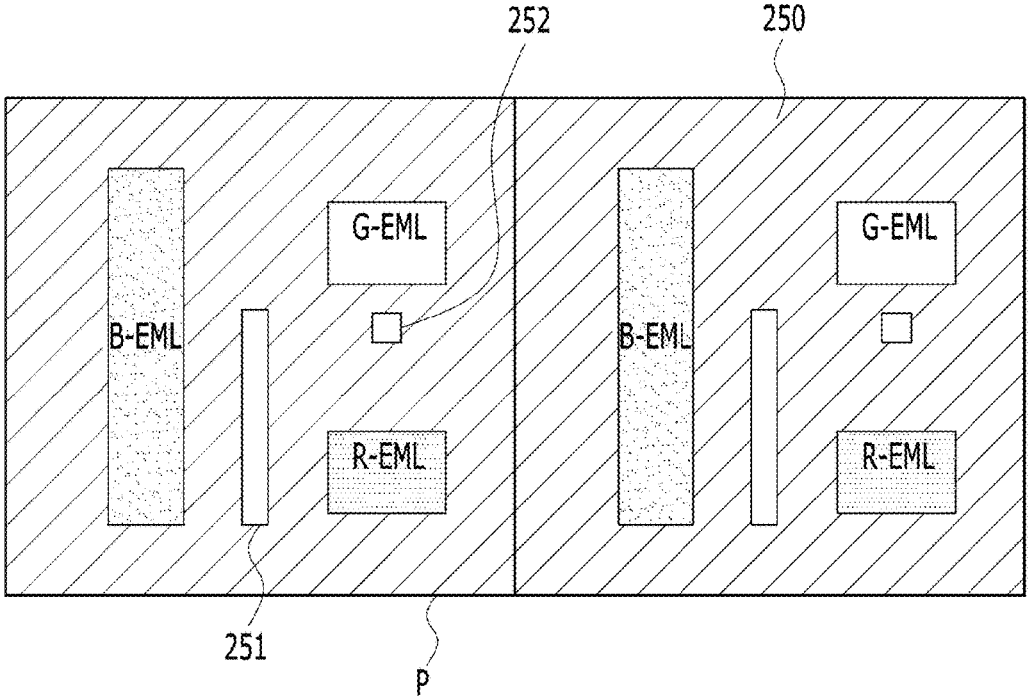
FIG. 5 is a plan view illustrating an organic light-emitting display device according to a second embodiment of the present invention.

FIG. 5 is a plan view illustrating an organic light-emitting display device according to a second embodiment of the present invention.

As illustrated in FIG. 5, in the organic light-emitting display device according to the second embodiment of the present invention, a first spacer 251 having a negatively tapered shape has a smaller length, which corresponds to the length of the second sub-pixel Sub 2, compared to the first embodiment of FIG. 2.

In this case, the first spacer 251 does not neighbor the emission portion G-EML of the third sub-pixel Sub 3. The illustrated exemplary structure is adopted in the case where the possibility of the red sub-pixel being turned on by leakage current is higher than the possibility of the green sub-pixel being turned on by leakage current when the blue sub-pixel is selectively driven. In consideration of the fact that the resistance of the second electrode (cathode) (see 120 in FIGS. 2 and 3) is increased when the first spacer 251, having a negatively tapered shape, is formed over a larger area, the first spacer 251 is provided between the blue sub-pixel and the red sub-pixel, which have the most severe current leakage. Here, a second spacer 252 having a positively tapered shape has a length that corresponds to a portion of the length of the first spacer 251 and is located between the second sub-pixel Sub 2 and the third sub-pixel Sub 3. As such, when a fine metal mask, which is used to form at least one layer of the organic stack (see 115 in FIGS. 2 and 3), droops by the weight thereof, the second spacer 252 may first be brought into contact with the fine metal mask than the first spacer 251, thereby preventing the first spacer 251 or the bank 250 from being pushed.

The other configurations are the same as in the above-described embodiments, and a description related to corresponding parts will be omitted.

*Third Embodiment*

Figure 6:
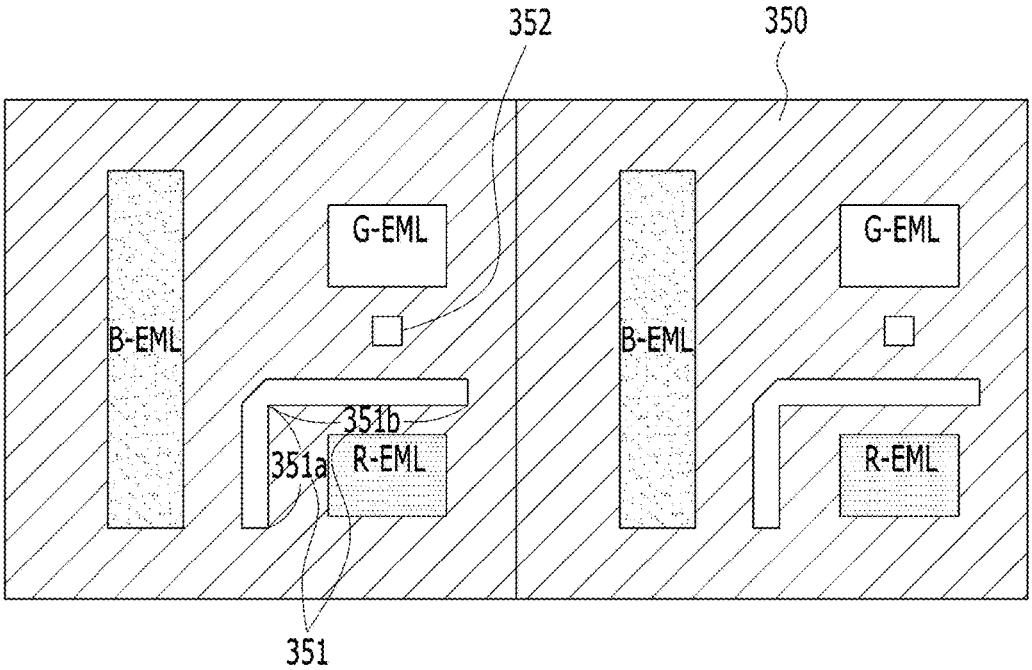
FIG. 6 is a plan view illustrating an organic light-emitting display device according to a third embodiment of the present invention.

FIG. 6 is a plan view illustrating an organic light-emitting display device according to a third embodiment of the present invention.

As illustrated in FIG. 6, in the organic light-emitting display device according to the third embodiment of the present invention, a first spacer 351 includes a first segment 351a parallel to the longitudinal direction of the first sub-pixel, and a second segment 351b protruding from the first segment 351a so as to extend between the second and third sub-pixels in the direction crossing the longitudinal direction.

The first segment 351a and the second segment 351b are directly connected to each other. That is, the first segment 351a and the second segment 351b are integrally patterned and physically connected to form the first spacer 351.

In this case, the organic stack 115 is electrically disconnected on the lateral portion of the first spacer 351. As such, at least the periphery of the emission portion R-EML of the red sub-pixel is electrically disconnected in at last a common layer with the neighboring blue sub-pixel and green sub-pixel, thereby preventing lateral current leakage.

*Fourth Embodiment*

Figure 7:
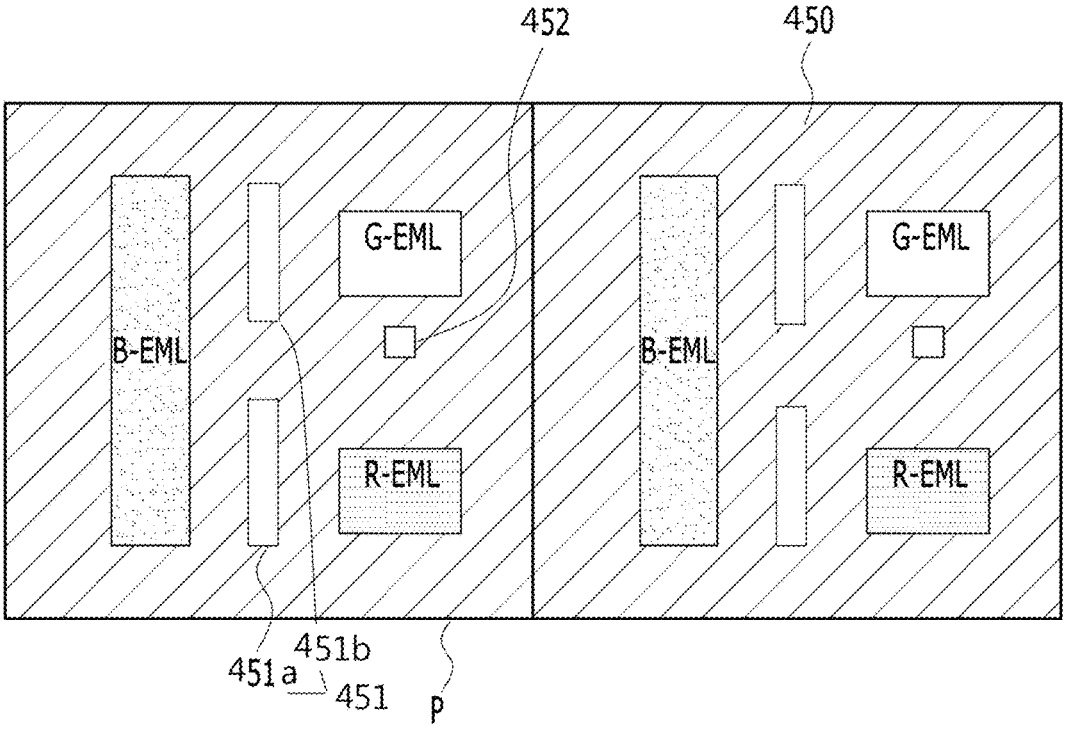
FIG. 7 is a plan view illustrating an organic light-emitting display device according to a fourth embodiment of the present invention.

FIG. 7 is a plan view illustrating an organic light-emitting display device according to a fourth embodiment of the present invention.

As illustrated in FIG. 7, in the organic light-emitting display device according to the fourth embodiment of the present invention, a first spacer 451 includes a first spacer pattern 451a and a second spacer pattern 451b, which are spaced apart from each other in a single pixel P. As such, the first sub-pixel Sub 1 and the second sub-pixel Sub 2 are electrically disconnected, and the first sub-pixel Sub 1 and the third sub-pixel Sub 3 are electrically disconnected.

Meanwhile, in the respective embodiments of the organic light-emitting display device of the present invention described above, a spacer having a negatively tapered shape is commonly located on a bank between neighboring sub-pixels so that an organic stack, which is deposited after the spacer is formed, is partially disconnected on the negatively tapered spacer, which may prevent lateral current leakage due to an organic layer having high conductivity.

In addition, when the negatively tapered spacer provided on the bank has a limited length and width, a second electrode, which is formed after the organic stack is deposited, may maintain even sheet resistance for each area.

In addition, because the negatively tapered spacer has a low threshold voltage Vth, when the spacer is disposed around a sub-pixel that is vulnerable to lateral leakage current, it is possible to prevent an adjacent sub-pixel from being turned on by leakage current.

Hereinafter, the effects of organic light-emitting display devices according to a comparative example and the first to third embodiments of the present invention will be described in connection with various experiments.

Figure 8:
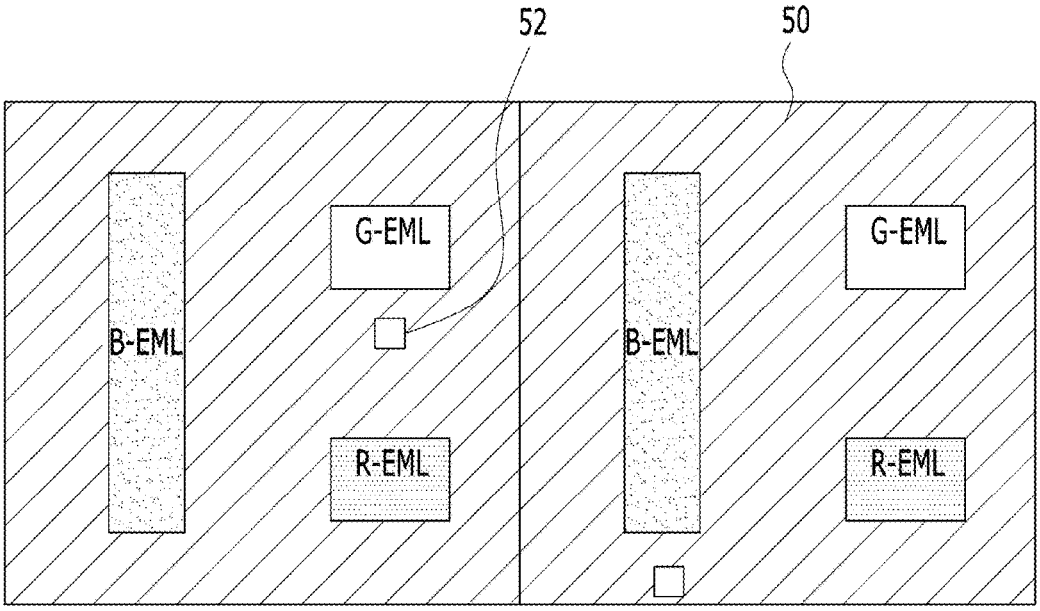
FIG. 8 is a plan view illustrating an organic light-emitting display device according to a comparative example.

FIG. 8 is a plan view illustrating an organic light-emitting display device according to a comparative example.

As illustrated in FIG. 8, the organic light-emitting display device according to the comparative example has a difference in that no spacer having a negatively tapered shape is provided, but a spacer 52 having a tapered shape is provided on a bank 50, compared to the structure of the organic light-emitting display device of the present invention described above. The comparative example does not implement the invention, and is described below with reference to FIGS. 9 through 12 for comparison against the present invention.

Hereinafter, examples in which low-gradation in the comparative example and the first to third embodiments of the present invention was observed for each sub-pixel using an optical microscope, and color observed in the organic light-emitting display device when the actual entire screen is illuminated blue will be described.

An organic stack in an organic light-emitting diode, which is used in the comparative example and the organic light-emitting display device of the present invention, has a two-stack structure, which is formed by the following sequence.

Now, the sequence of forming the organic stack will be described. First, a first electrode (anode) is formed on a substrate. A hole injection layer is formed on the first electrode by doping the first electrode with a p-type dopant, such as TCNQF4, in an amount of 3 wt %. Here, a host of the hole injection layer is the same material as that in a first hole transport layer, which is formed in a subsequent process. Subsequently, as a first stack, the first hole transport layer, which includes the same host as the hole injection layer, is formed using NPD to a thickness of 400 Å. Subsequently, a first light-emitting layer for a blue sub-pixel is formed by doping an anthracene derivative host having a thickness of 200 Å with an anthracene-based dopant in an amount of 5 wt %, and a first electron transport layer is formed to a thickness of 150 Å.

Subsequently, an n-type charge generation layer is formed by doping a host material of an anthracene derivative charge generation layer having a thickness of 150 Å with Li in an amount of 1 wt %, and successively, a p-type charge generation layer is formed by doping NPD with a p-type dopant, such as TCNQ4, in an amount of 15 wt %.

As a second stack, after a second hole transport layer is formed, a second light-emitting layer is formed using the same host and the same dopant as were used for the first light-emitting layer, and successively, a second electron transport layer is formed.

Subsequently, after LiQ and the material of the electron transport layer, which have a content ratio of 1:1, are formed on the electron transport layer to a thickness of 300 Å, Mg and LiF, which have a content ratio of 1:1, are formed to a thickness of 30 Å over the entire area. Then, a second electrode is formed using Ag and Mg, which have a content ratio of 3:1, to a thickness of 160 Å, and thereafter, a capping layer is formed thereon using NPD to a thickness of 650 Å.

Here, red, green and blue light-emitting layers are deposited in the respective sub-pixels using a fine metal mask. The above example has described the formation of the light-emitting layer for the blue sub-pixel, the light-emitting layer for the green sub-pixel is formed to a thickness of 400 Å, the light-emitting layer for the red sub-pixel is formed to a thickness of 600 Å, and the other layers are used in common.

The above-described structure illustrates the configuration of the organic stack and the second electrode in the comparative example and the organic light-emitting display device of the present invention, and the degree of lateral current leakage was evaluated by verifying colors at G255 (high gradation) and G31 (low gradation) based on the same configuration.

Figure 9:
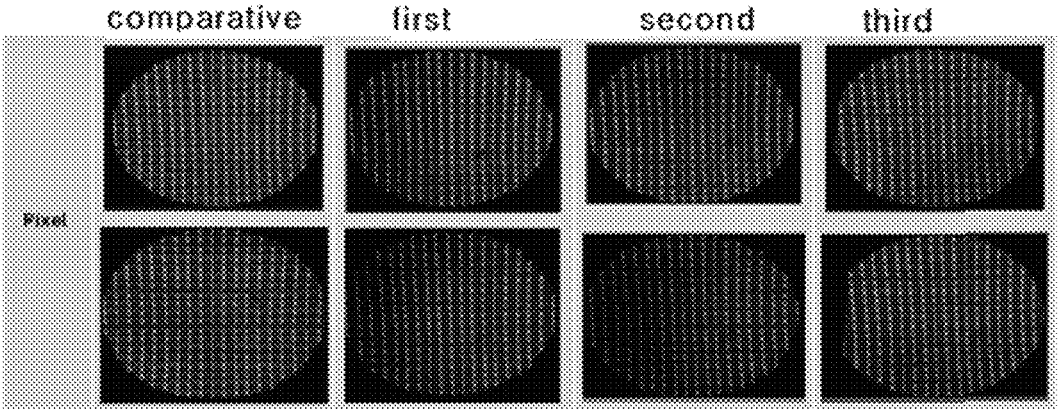
FIG. 9 is micrographs captured by an optical microscope illustrating the case where a blue sub-pixel is turned on according to the comparative example and the first to third embodiments of the present invention.
Figure 10:
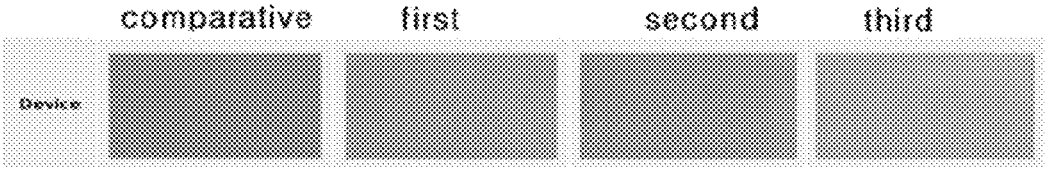
FIG. 10 is photographs illustrating a screen when the blue sub-pixel is turned on according to the comparative example and the first to third embodiments of the present invention.

FIG. 9 is micrographs captured by an optical microscope illustrating the case where a blue sub-pixel is turned on according to the comparative example and the first to third embodiments of the present invention, and FIG. 10 is photographs illustrating a screen when the blue sub-pixel is turned on according to the comparative example and the first to third embodiments of the present invention.

Considering the micrographs and the screen, it can be seen in the comparative example that the red sub-pixel is turned on by leakage current when the blue sub-pixel is selectively turned on, causing degradation in the purity of blue and realizing a color that is close to purple.

On the other hand, when the first to third embodiments of the present invention are applied, it can be seen that the red sub-pixel is almost never turned on, and thus the screen appears blue.

TABLE 1

| | Comparison per gradation | | | | | | | |
|---|---|---|---|---|---|---|---|---|
| | G255 | | | | | | | |
| | Drive Voltage | Efficiency | | | G31 | | Δu' | Change |
| Classification | (V) | (Cd/A) | Bx | By | Bx | By | v' | Rate |
| Comparative Example | 6.5 | 8.8 | 0.142 | 0.069 | 0.220 | 0.155 | 0.145 | 100% |
| First Embodiment | 6.4 | 8.8 | 0.142 | 0.069 | 0.159 | 0.115 | 0.079 | 55% |
| Second Embodiment | 6.5 | 8.9 | 0.142 | 0.069 | 0.160 | 0.129 | 0.087 | 60% |
| Third Embodiment | 6.5 | 8.8 | 0.142 | 0.068 | 0.163 | 0.124 | 0.092 | 64% |

Figure 11:
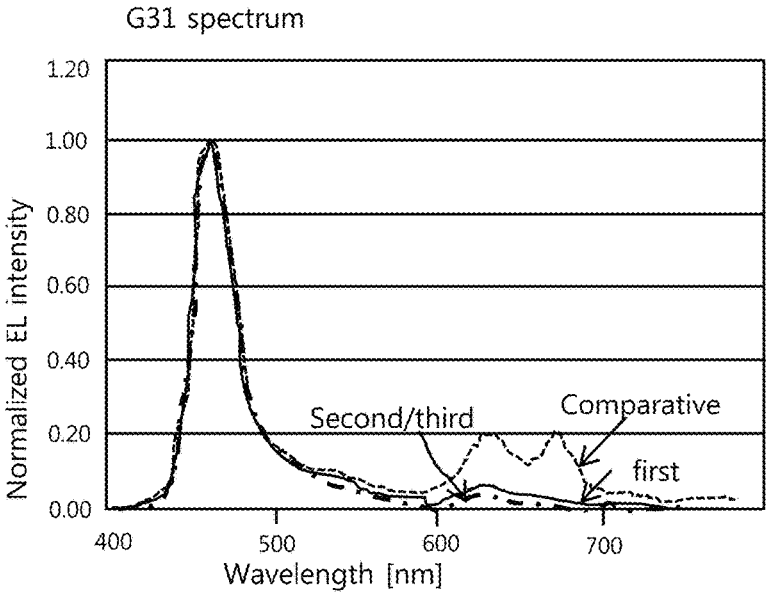
FIG. 11 is a graph illustrating the normalized EL intensity for respective wavelengths when the blue sub-pixel is turned on according to the comparative example and the first to third embodiments of the present invention.
Figure 12:
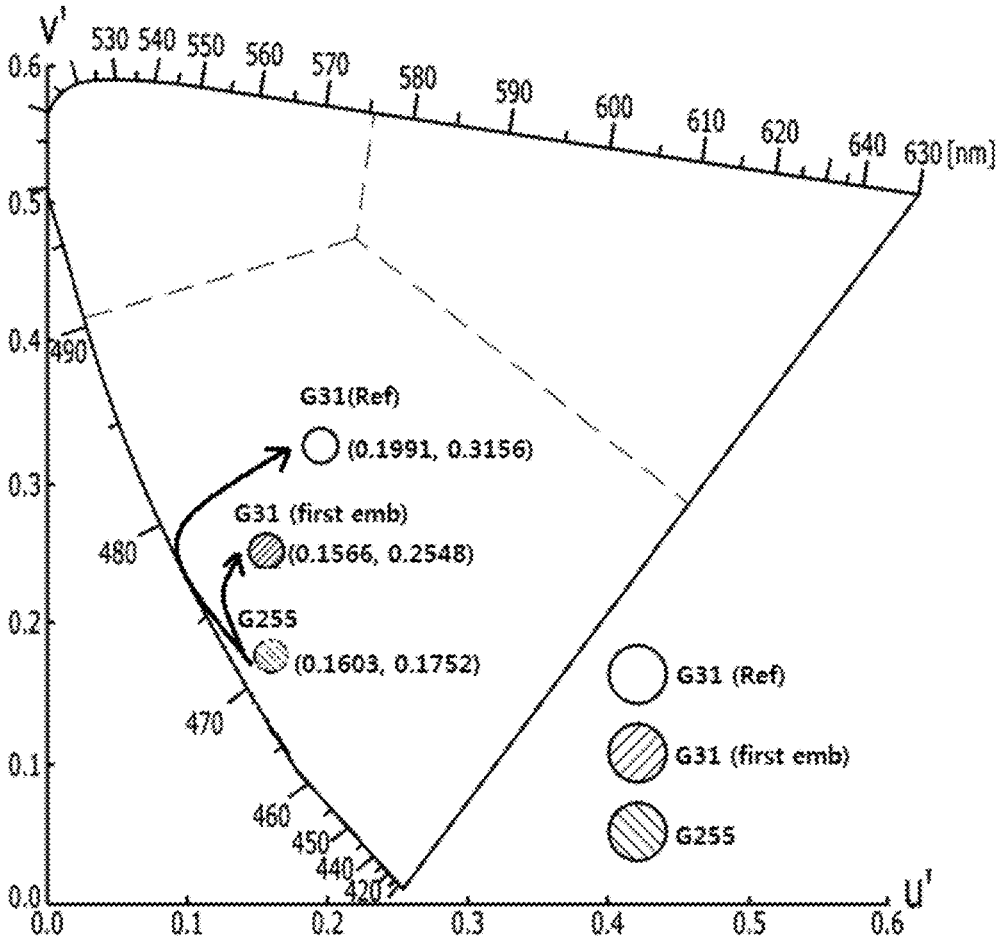
FIG. 12 is a view illustrating variation in color coordinate between low gradation and high gradation when the blue sub-pixel is turned on according to the comparative example and the first embodiment of the present invention.

FIG. 11 is a graph illustrating the normalized EL intensity for respective wavelengths when the blue sub-pixel is turned on according to the comparative example and the first to third embodiments of the present invention, and FIG. 12 is a view illustrating variation in color coordinate between low gradation and high gradation when the blue sub-pixel is turned on according to the comparative example and the first embodiment of the present invention.

Considering Table 1 and FIG. 12, although the comparative example and the first to third embodiments of the present invention have substantially no difference in color coordinates upon high gradation (G255) blue display, the comparative example shows poor blue and mixture of red and blue at low gradation (G31), thus causing degradation in the purity of color.

In particular, referring to FIG. 11, the tendency described above is evident, and a red wavelength appears at low gradation (G31). This numerically represents that the red sub-pixel is turned on by leakage current even when only the blue sub-pixel is turned on in the comparative example. On the other hand, in the case of the first to third embodiments of the present invention, it can be seen that a red wavelength almost never appears even at low gradation and that lateral current leakage is prevented.

Hereinafter, the meaning of the length of the first spacer according to the present invention will be described.

When the length of the emission portion of the blue sub-pixel was 55 μm, the length of the first spacer was 55 μm in a first experimental example, the length of the first spacer was 30 μm in a second experimental example, and the length of the first spacer was 60 μm in a third experimental example. In a comparative example, no first spacer was provided.

Figure 13:
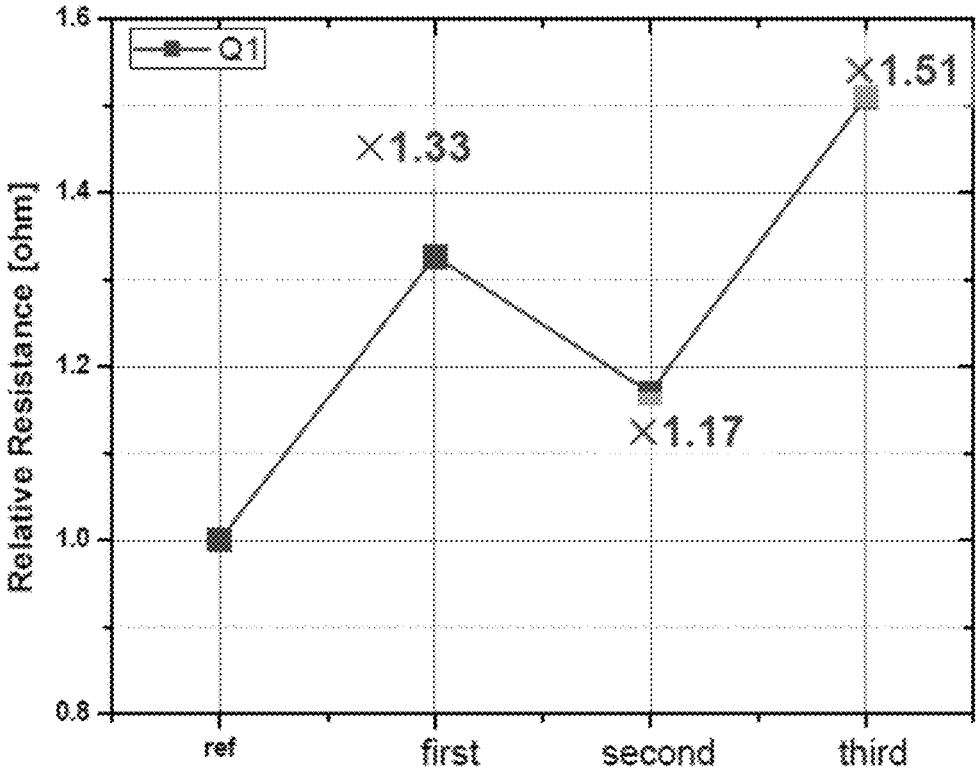
FIG. 13 is a graph illustrating the relative resistance according to a comparative example and first to third experimental examples.

FIG. 13 is a graph illustrating the relative resistance according to a comparative example and first to third experimental examples.

FIG. 13 illustrates the ratio of relative resistance of the second electrode in the first to third experimental examples when the relative resistance of the second electrode is assumed to 1 in the comparative example (having no first spacer). It can be seen that the ratio of relative resistance was 1.33 in the first experimental example, 1.17 in the second experimental example, and 1.51 in the third experimental example, and thus the ratio of relative resistance is proportional to the length of the first spacer.

Figure 14:
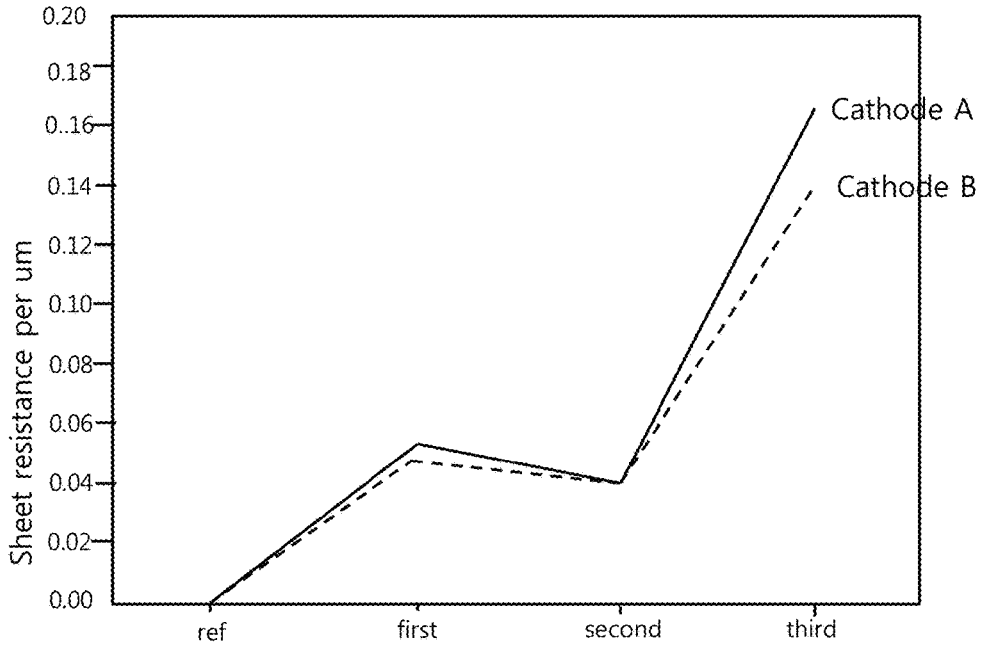
FIG. 14 is a graph illustrating sheet resistance according to the comparative example and the first to third experimental examples.

FIG. 14 is a graph illustrating sheet resistance according to the comparative example and the first to third experimental examples.

Referring to FIG. 14 and Table 2, when verifying the rate of increase in sheet resistance for the length of the first spacer, the rate of increase in sheet resistance greatly increases when the length of the first spacer is greater than the length of the emission portion of the blue sub-pixel. That is, the rate of increase in sheet resistance was about 0.04 Ω/μm to 0.05 Ω/μm when the length of the first spacer is smaller than the length of the emission portion of the blue sub-pixel, whereas the rate of increase in sheet resistance was about 0.14 Ω/μm to 0.17 Ω/μm when the length of the first spacer is greater than the length of the emission portion of the blue sub-pixel. Thus, it can be seen that the sheet resistance is increased approximately three times or more in the latter case than in the former case.

That is, it could be verified from the above experiments that the resistance of the second electrode may be evenly maintained without deterioration in brightness in the organic light-emitting display device when the length of the first spacer is smaller than the length of the emission portion of the blue sub-pixel (i.e. the pixel having the longest emission portion).

TABLE 2

| | Length of First spacer | Rate of Increase in Sheet Resistance for Length of First Spacer | |
|---|---|---|---|
| Classification | [μm] | Cathode A | Cathode B |
| First Experimental Example | 52 | 0.04 | 0.04 |
| Second Experimental Example | 30 | 0.052 | 0.05 |
| Third Experimental Example | 60 | 0.167 | 0.14 |

It can be verified from the above-described experiments that resistance remarkably increases when the length of the first spacer is greater than the length of the emission portion of the blue sub-pixel, and consequently, that the length of the first spacer needs to be limited within a range in which the sheet resistance of the second electrode is maintained at a reliable level.

Embodiments of the organic light-emitting display device have, among others, the following advantages.

First, a spacer having a negatively tapered shape is disposed on a bank between neighboring sub-pixels so that an organic stack prevents lateral current leakage due to an organic layer having high conductivity. When the negatively tapered spacer having a low voltage threshold is disposed around a sub-pixel that is vulnerable to lateral leakage current, it is possible to prevent an adjacent sub-pixel from being turned on by leakage current Second, although the presence of the negatively tapered spacer may increase the overall sheet resistance of the second electrode. But the negative impact of the increased sheet resistance can be alleviated by limiting the length and width of the negatively tapered spacer provided on the bank.

Although the embodiments of the present invention have been described above in detail with reference to the accompanying drawings, it will be apparent to those skilled in the art that the present invention described above is not limited to the embodiments described above, and various substitutions, modifications, and alterations may be devised within the spirit and scope of the present invention. Accordingly, various embodiments disclosed in the present invention are not intended to limit the technical sprit of the present invention, and the scope of the technical sprit of the present invention is not limited by the embodiments. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure.

What is claimed is:

[1. An organic light-emitting display device comprising:

a substrate including a plurality of pixels, each pixel comprising a first sub-pixel, a second sub-pixel and a third sub-pixel, each of the first to third sub-pixels having an emission portion and a non-emission portion surrounding the emission portion;

a first electrode on the emission portion of each of the first to third sub-pixels;

a bank on the non-emission portion;

a first spacer having a negatively tapered shape and provided on the bank at least between the first sub-pixel and the second sub-pixel;

a second spacer placed between the second sub-pixel and the third sub-pixel, wherein the second spacer is higher than the first spacer;

an organic stack above the first electrode and the first spacer, wherein the organic stack on the first electrode is spaced from sides of the first electrode; and a second electrode disposed on the organic stack, wherein a length of the first spacer in a first direction is shorter than a dimension of the first sub-pixel in the first direction, the second sub-pixel and the third sub-pixel separated from the first sub-pixel in a second direction crossing the first direction, and wherein the first spacer is placed to block the emission portion of the second sub-pixel from the emission portion of the first sub-pixel.]

[2. The device according to claim 1, wherein the length of the first spacer in the first direction is greater than a dimension of the emission portion of the second sub-pixel in the first direction.]

[3. The device according to claim 1, wherein the second sub-pixel and the third sub-pixel are alternately disposed in the first direction, and wherein the first spacer extends between the first sub-pixel and the third sub-pixel.]

[4. The device according to claim 3, wherein the first sub-pixel extends in the first direction at least to an edge of the third sub-pixel, the edge located at a side of the third pixel away from the second sub-pixel.]

[5. The device according to claim 1, wherein the first spacer comprises a first segment between the first sub-pixel and the second sub-pixel and a second segment between the second sub-pixel and the third sub-pixel, wherein the first segment and the second segment are directly connected.]

[6. The device according to claim 5, wherein the second segment is longer than a dimension of the second sub-pixel or a dimension of the third sub-pixels in the second direction.]

[7. The device according to claim 1, wherein the first spacer comprises a first segment between the first sub-pixel and the second sub-pixel, and a second segment between the first sub-pixel and the third sub-pixel, and the first segment and the second segment are separated in the first direction.]

[8. The device according to claim 1, wherein the first spacer has a width ranging from 1 μm to 5 μm in the second direction crossing the first direction.]

[9. The device according to claim 1, wherein a threshold voltage of the first sub-pixel is higher than a threshold voltage of the second sub-pixel.]

[10. The device according to claim 1, wherein the second sub-pixel and the third sub-pixel smaller than the first sub-pixel.]

[11. The device according to claim 1, wherein the organic stack includes a hole injection layer contacting the first electrode and at least one stack, each of the at least one stack including a sequential stack of a hole transport layer, a light-emitting layer, and an electron transport layer.]

[12. The device according to claim 11, wherein the organic stack comprises a plurality of stacks, each of the stack including a sequential stack of a hole transport layer, a light-emitting layer and an electron transport layer, the device further including a charge generation layer between the plurality of stacks.]

[13. The device according to claim 11, wherein at last one layer of the organic stack has a gap at sides of the first spacer.]

[14. The device according to claim 11, wherein at least one layer of the organic stack on the first spacer has an island shape.]

[15. The device according to claim 1, wherein the first sub-pixel is a blue sub-pixel, the second sub-pixel is a red sub-pixel, and the third sub-pixel is a green sub-pixel.]

[16. An organic light emitting device, comprising:

a first sub-pixel in a pixel configured to emit light of a first color, the first sub-pixel comprising two first electrodes and a first portion of an organic stack sandwiched between the two first electrodes;

a second sub-pixel adjacent to and spaced apart from the first sub-pixel in the pixel, the second sub-pixel configured to emit light of a second color, the second sub-pixel comprising two second electrodes and a second portion of the organic stack sandwiched between the two second electrodes;

a third sub-pixel configured to emit light of a third color, the third sub-pixel comprising two third electrodes and a third portion of the organic stack sandwiched between the two third electrodes, wherein the second sub-pixel and the third sub-pixel are alternately disposed in a first direction, adjacent to the first sub-pixel;

a first spacer between the first sub-pixel and the second sub-pixel, the first spacer placed to block the second portion of the organic stack of the second sub-pixel from the first portion of the organic stack of the first sub-pixel; and a second spacer placed between the second sub-pixel and the third sub-pixel, wherein the second spacer is higher than the first spacer, wherein a length of the first spacer in the first direction is shorter than a dimension of an emission portion of the first sub-pixel in the first direction, the second sub-pixel separated from the first sub-pixel in a second direction crossing the first direction.]

*17. An organic light-emitting display device comprising:*

*a substrate including a plurality of pixels, the plurality of pixels comprising a first sub-pixel, a second sub-pixel and a third sub-pixel, each of the first to third sub-pixels having an emission portion and a non-emission portion surrounding the emission portion;*

*a first electrode on the emission portion of each of the first to third sub-pixels;*

*a bank on the non-emission portion;*

*a first spacer between the emission portion of the first sub-pixel and the emission portion of the second sub-pixel to block the emission portion of the second sub-pixel from the emission portion of the first sub-pixel;*

*a second spacer placed between the second sub-pixel and the third sub-pixel, wherein the second spacer is higher in height in a vertical direction from the bank than the first spacer;*

*an organic stack above the first electrode and the first spacer, wherein the organic stack has at least a first organic stack, a second organic stack, and a charge generation layer, the first organic stack disposed on the first electrode and the first spacer, the second organic stack disposed on the first organic stack, and the charge generation layer disposed between the first and second organic stacks; and*

*a second electrode on the organic stack.*

*18. The organic light-emitting display device according to claim 17, further comprising a capping layer on the second electrode.*

*19. The organic light-emitting display device according to claim 18, wherein at least one of the organic stack, the second electrode, and the capping layer has a disconnected portion on at least one side of the first spacer.*

*20. The organic light-emitting display device according to claim 18, wherein at least one of the organic stack, the second electrode, and the capping layer has an island shape.*

*21. The organic light-emitting display device according to claim 17, wherein a first thickness of a first color light-emitting layer for the first sub-pixel is different from a second thickness of a second color light-emitting layer for the second sub-pixel, and the second thickness of the second color light-emitting layer is different from a third thickness of a third color light-emitting layer for the third sub-pixel.*

*22. The organic light-emitting display device according to claim 17, wherein the charge generation layer comprises a p-type charge generation layer and an n-type charge generation layer.*

*23. The organic light-emitting display device according to claim 17, wherein at least one of the second sub-pixel and the third sub-pixel is smaller than the first sub-pixel in a first direction.*

*24. The organic light-emitting display device according to claim 17, wherein a length of the first spacer in a first direction is shorter than a length of the emission portion of the first sub-pixel in the first direction and longer than a length of the emission portion of the second sub-pixel.*

*25. The organic light-emitting display device according to claim 24, wherein the second sub-pixel and the third sub-pixel are separated from the first sub-pixel in a second direction crossing the first direction and wherein the second sub-pixel and the third sub-pixel are alternately disposed in the first direction.*

*26. The organic light-emitting display device according to claim 24, wherein the first spacer extends between the first sub-pixel and the third sub-pixel.*

*27. The organic light-emitting display device according to claim 24, wherein the first sub-pixel extends in the first direction at least to an edge of the third sub-pixel, the edge located at a side of the third sub-pixel away from the second sub-pixel.*

*28. The organic light-emitting display device according to claim 17, wherein the first spacer comprises a first segment between the first sub-pixel and the second sub-pixel and a second segment between the second sub-pixel and the third sub-pixel, wherein the first segment and the second segment are directly connected.*

*29. The organic light-emitting display device according to claim 17, wherein the first spacer comprises a first segment between the first sub-pixel and the second sub-pixel, and a second segment between the first sub-pixel and the third sub-pixel, and the first segment and the second segment are separated in a first direction.*

*30. The organic light-emitting display device according to claim 29, wherein the second segment is longer than a dimension of the second sub-pixel or a dimension of the third sub-pixels in the first direction.*

*31. The organic light-emitting display device according to claim 17, wherein a threshold voltage of the first sub-pixel is highest among the first to third sub-pixels.*

*32. The organic light-emitting display device according to claim 17, wherein a size of the second spacer is different from a size of the first spacer.*

* * * * *